(12) United States Patent
King et al.

(10) Patent No.: US 12,262,545 B2
(45) Date of Patent: Mar. 25, 2025

(54) THREE-DIMENSIONAL RESISTIVE RANDOM ACCESS MEMORY STRUCTURE

(71) Applicant: NATIONAL TSING HUA UNIVERSITY, Hsinchu (TW)

(72) Inventors: Ya-Chin King, Hsinchu (TW); Chrong-Jung Lin, Hsinchu (TW); Yao-Hung Huang, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 505 days.

(21) Appl. No.: 17/814,532

(22) Filed: Jul. 25, 2022

(65) Prior Publication Data

US 2023/0240083 A1 Jul. 27, 2023

(30) Foreign Application Priority Data

Jan. 24, 2022 (TW) .................................. 111102999

(51) Int. Cl.
*H10B 63/00* (2023.01)
*H01L 23/522* (2006.01)
*H01L 23/528* (2006.01)
*H10N 70/20* (2023.01)

(52) U.S. Cl.
CPC ......... *H10B 63/84* (2023.02); *H01L 23/5226* (2013.01); *H01L 23/5283* (2013.01); *H10B 63/34* (2023.02); *H10N 70/253* (2023.02)

(58) Field of Classification Search
CPC ..... H10B 63/84; H10B 63/34; H01L 23/5226; H01L 23/5283; H10N 70/253
See application file for complete search history.

(56) References Cited

U.S. PATENT DOCUMENTS

2023/0171968 A1* 6/2023 Venkatesan .......... H10N 70/011
257/5

* cited by examiner

*Primary Examiner* — J. E. Schoenholtz
*Assistant Examiner* — Joe Schoenholtz
(74) *Attorney, Agent, or Firm* — CKC & Partners Co., LLC (57) ABSTRACT

A three-dimensional resistive random access memory structure includes a base layer, a first layer, a second layer, a third layer and a fourth layer. The first layer includes two first conductive layers and a first via. One of the two first conductive layers is electrically connected between the base layer and the first via. The second layer includes three second conductive layers and two second vias. Two first resistive elements are formed between one of the two second vias and two of the three second conductive layers. The third layer includes three third conductive layers and two third vias. Two second resistive elements are formed between one of the two third vias and two of the three third conductive layers. The fourth layer includes a fourth conductive layer. The fourth conductive layer is electrically connected to the two third vias.

10 Claims, 7 Drawing Sheets

THREE-DIMENSIONAL RESISTIVE RANDOM ACCESS MEMORY STRUCTURE

RELATED APPLICATIONS

This application claims priority to Taiwan Application Serial Number 111102999, filed Jan. 24, 2022, which is herein incorporated by reference.

BACKGROUND

Technical Field

The present disclosure relates to a memory structure. More particularly, the present disclosure relates to a three-dimensional resistive random access memory structure.

Description of Related Art

The conventional resistive random access memory (RRAM) disposes an insulating layer between two electrodes, and the insulating layer has a conductive material. When a bias voltage is applied to the two electrodes, the conductive material of the insulating layer forms a conductive filament to let the two electrodes connect to each other conductively, and form a low resistance state (LRS). The resistive random access memory turns into a high resistance state (HRS) when a larger reset current is applied to the resistive random access memory, which is in a low resistance state. Therefore, the signal of the memory is determined to 0 or 1 by switching the resistive random access memory into the low resistance state or the high resistance state.

By the miniature of the semiconductor process, the developing technique of the conventional non-volatile memory meets a great challenge, and developing a three-dimensional resistive random access memory structure with high density and high volume under a limitation of an area is commercially desirable.

SUMMARY

According to one aspect of the present disclosure, a three-dimensional resistive random access memory structure includes a base layer, a first layer, a second layer, a third layer and a fourth layer. The first layer includes two first conductive layers and a first via. One of the two first conductive layers is electrically connected between the base layer and the first via. The second layer includes three second conductive layers and two second vias. Two first resistive elements are formed between one of the two second vias and two of the three second conductive layers. Another one of the three second conductive layers is electrically connected between the first via and another one of the two second vias. The two of the three second conductive layers are extended along a first direction. The third layer includes three third conductive layers and two third vias. Two second resistive elements are formed between one of the two third vias and two of the three third conductive layers. Another one of the three third conductive layers is electrically connected between the another one of the two second vias and another one of the two third vias. The two of the three third conductive layers are extended along a second direction. The fourth layer includes a fourth conductive layer. The fourth conductive layer is electrically connected to the two third vias. The first direction is vertical to the second direction.

According to another aspect of the present disclosure, a three-dimensional resistive random access memory structure includes a base layer, a first layer, a second layer and a third layer. The first layer is electrically connected to the base layer, and includes three first conductive layers and two first vias. Two of the three first conductive layers are electrically connected to the two first vias, respectively. The second layer includes four second conductive layers and four second vias. Four resistive elements are formed between two of the four second vias and two of the four second conductive layers. Another two of the four second conductive layers are electrically connected to the two first vias. The another two of the four second conductive layers are electrically connected to another two of the four second vias, respectively. The two of the four second conductive layers are extended along a first direction. The third layer includes two third conductive layers. The two third conductive layers are electrically connected to the four second vias. The two third conductive layers are extended along a second direction. The first direction is vertical to the second direction.

BRIEF DESCRIPTION OF THE DRAWINGS

The present disclosure can be more fully understood by reading the following detailed description of the embodiment, with reference made to the accompanying drawings as follows.

DETAILED DESCRIPTION

The embodiment will be described with the drawings. For clarity, some practical details will be described below. However, it should be noted that the present disclosure should not be limited by the practical details, that is, in some embodiment, the practical details is unnecessary. In addition, for simplifying the drawings, some conventional structures and elements will be simply illustrated, and repeated elements may be represented by the same labels.

It will be understood that when an element (or device) is referred to as be "connected to" another element, it can be directly connected to other element, or it can be indirectly connected to the other element, that is, intervening elements may be present. In contrast, when an element is referred to as be "directly connected to" another element, there are no intervening elements present. In addition, the terms first, second, third, etc. are used herein to describe various elements or components, these elements or components should not be limited by these terms. Consequently, a first element or component discussed below could be termed a second element or component.

Figure 1:
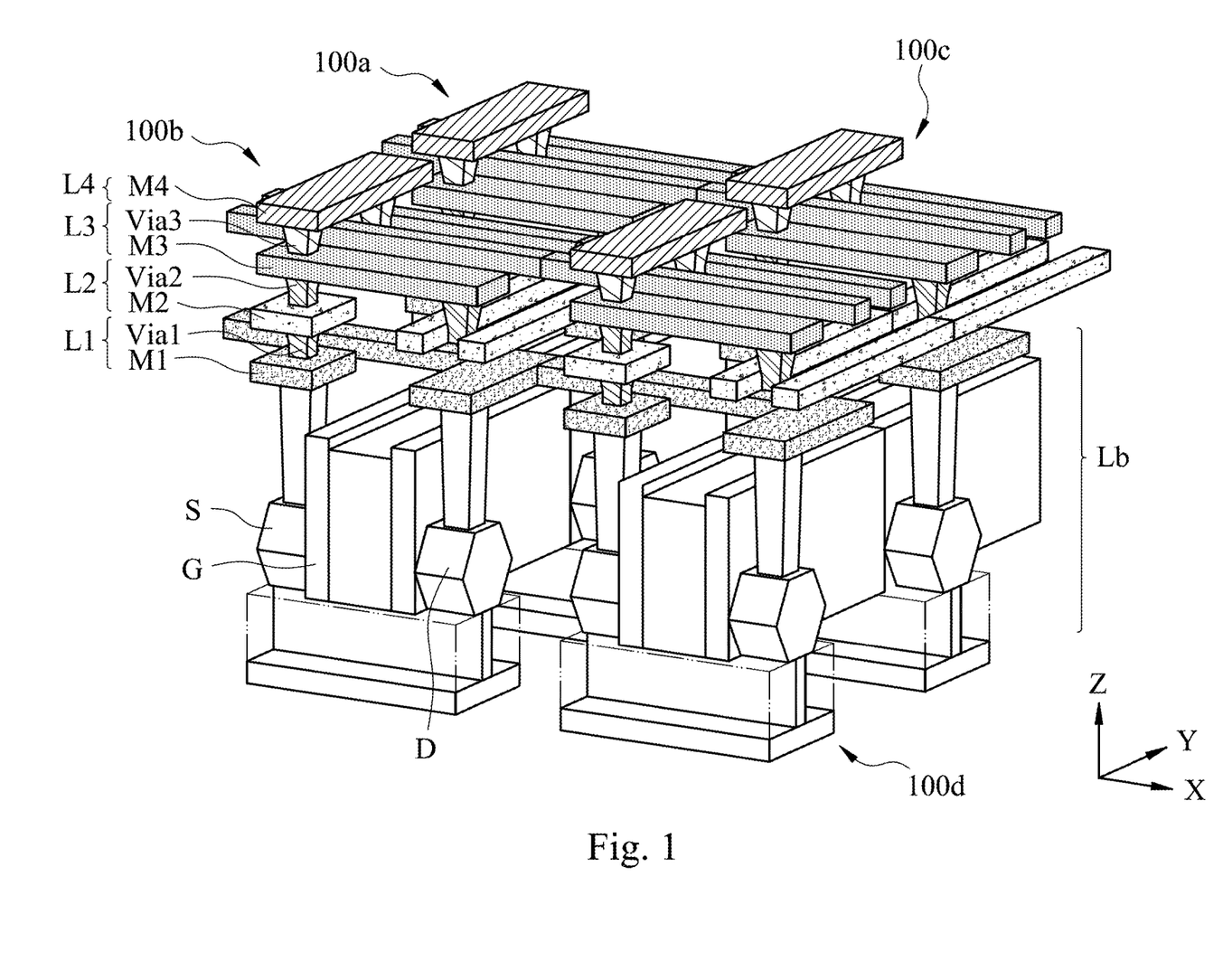
FIG. 1 shows a three-dimensional schematic view of a three-dimensional resistive random access memory structure according to a first embodiment of the present disclosure.

Please refer to FIG. 1. FIG. 1 shows a three-dimensional schematic view of a three-dimensional resistive random access memory structure 100a according to a first embodiment of the present disclosure. FIG. 1 shows four three-dimensional resistive random access memory structures 100a, 100b, 100c and 100d. Each of the four three-dimensional resistive random access memory structures 100a, 100b, 100c and 100d includes a base layer Lb, a first layer L1, a second layer L2, a third layer L3 and a fourth layer L4. The first layer L1 includes at least one first conductive layer M1 and at least one first via Via1. The second layer L2 includes at least one second conductive layer M2 and at least one second via Via2. The third layer L3 includes at least one third conductive layer M3 and at least one third via Via3. The fourth layer L4 includes at least one fourth conductive layer M4. The base layer Lb, the first layer L1, the second layer L2, the third layer L3 and the fourth layer L4 are stacked in sequence. In detail, the base layer Lb is a Fin Field-Effect Transistor (FinFET), and includes a gate electrode G, a drain electrode D and a source electrode S, but the present disclosure is not limited thereto.

Figure 2:
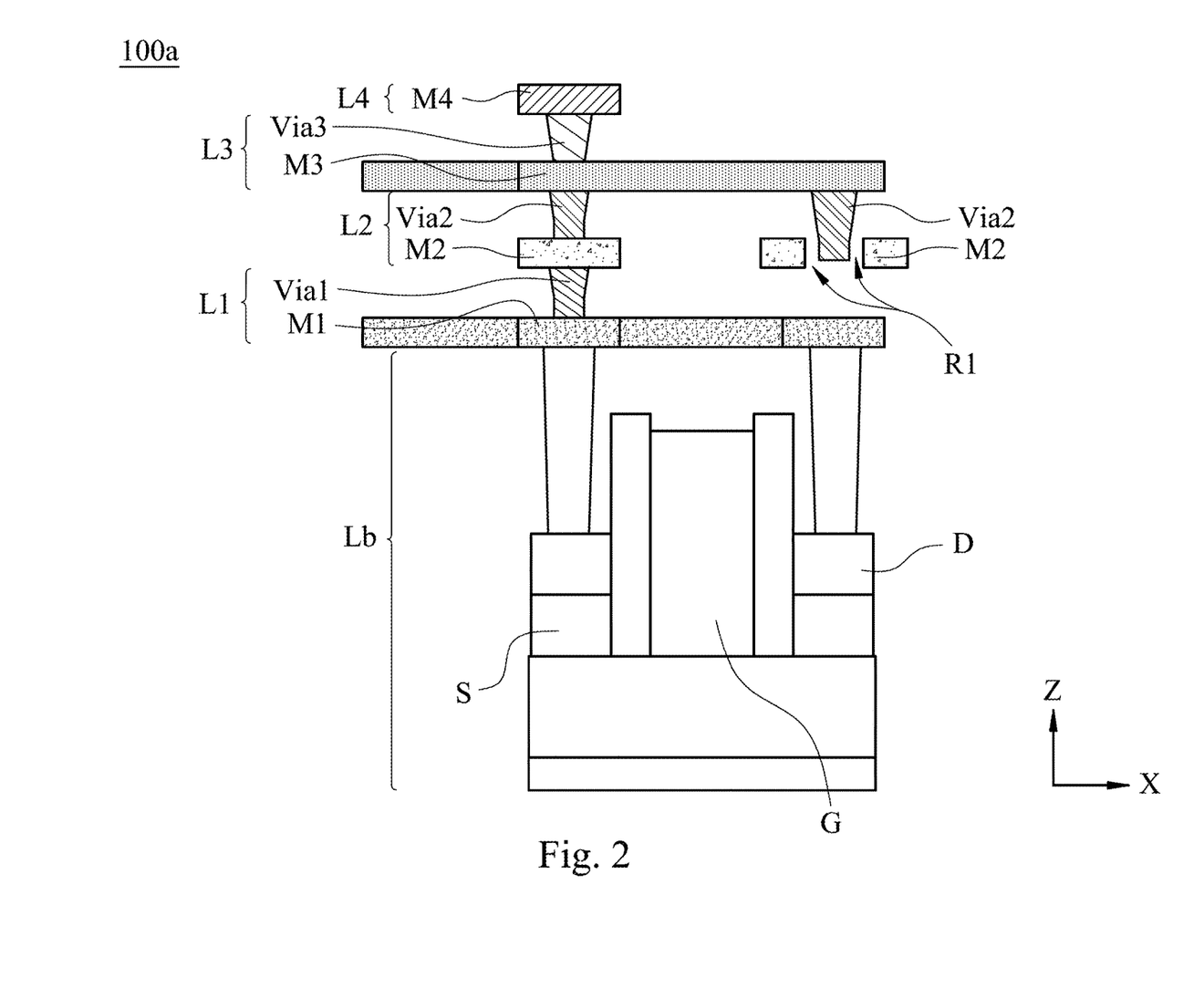
FIG. 2 shows a side view of the three-dimensional resistive random access memory structure in FIG. 1.
Figure 3:
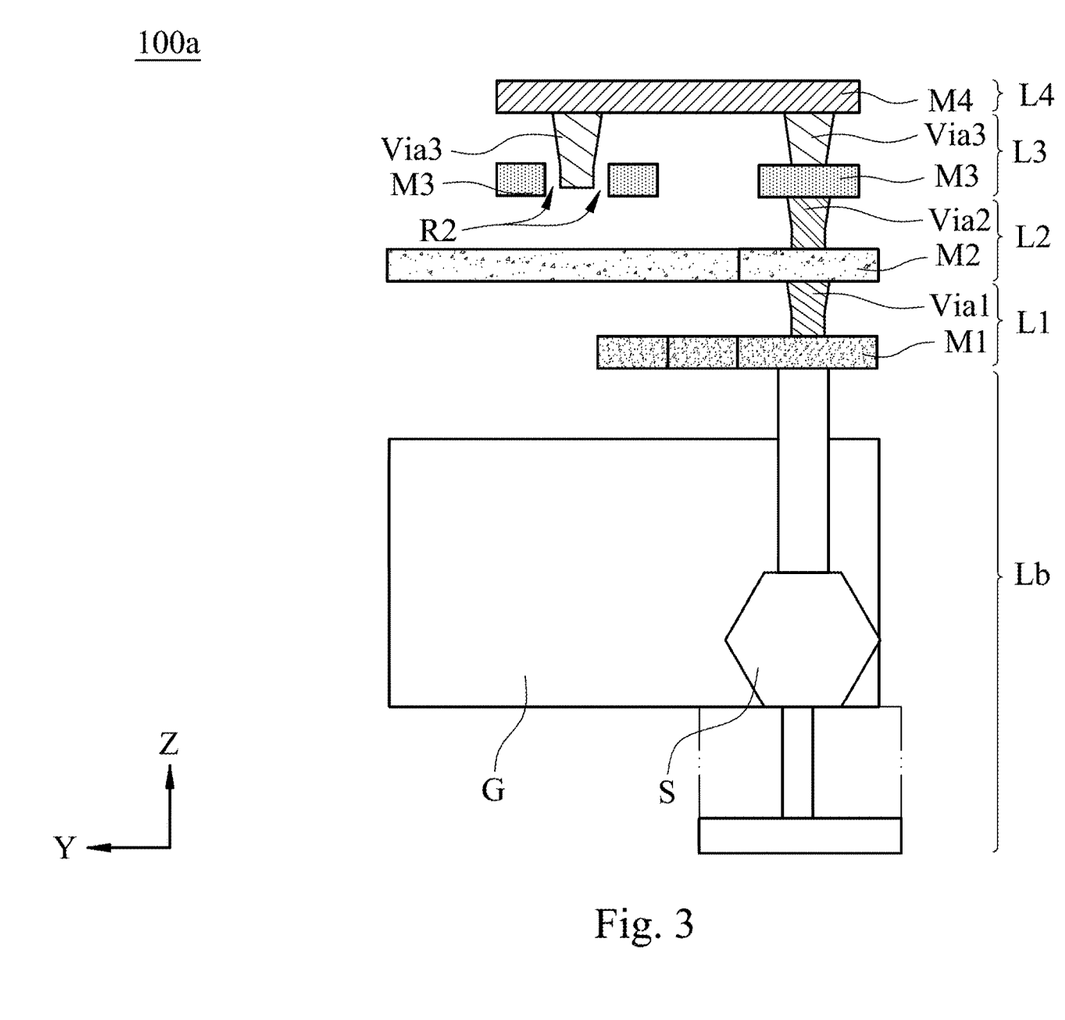
FIG. 3 shows another side view of the three-dimensional resistive random access memory structure in FIG. 1.

Please refer to FIG. 1 to FIG. 3. FIG. 2 shows a side view of the three-dimensional resistive random access memory structure 100a in FIG. 1. FIG. 3 shows another side view of the three-dimensional resistive random access memory structure 100a in FIG. 1. The first layer L1 includes two first conductive layers M1 and a first via Via1. One of the two first conductive layers M1 is electrically connected between the base layer Lb and the first via Via1. In other words, the two first conductive layers M1 are not connected to each other, the one of the two first conductive layers M1 is electrically connected to the source electrode S of the base layer Lb, and another one of the two first conductive layers M1 is electrically connected to the drain electrode D of the base layer Lb.

The second layer L2 includes three second conductive layers M2 and two second vias Via2. Two first resistive elements R1 are formed between one of the two second vias Via2 and two of the three second conductive layers M2. Another one of the three second conductive layers M2 is electrically connected between the first via Via1 and another one of the two second vias Via2. The two of the three second conductive layers M2 are extended along a first direction (i.e., a direction Y). Further, each of the two of the three second conductive layers M2 is in a strip-shape. The another one of the three second conductive layers M2 is electrically connected to the source electrode S of the base layer Lb via the first via Via1. The another one of the two second vias Via2 is disposed at the middle of the two of the three second conductive layers M2, which are in the strip-shape. Two gaps are formed between the one of the second vias Via2 and each of the two second conductive layers M2 in the strip-shape. The aforementioned gaps form the first resistive elements R1.

The third layer L3 includes three third conductive layers M3 and two third vias Via3. Two second resistive elements R2 are formed between one of the two third vias Via3 and two of the three third conductive layers M3. Another one of the three third conductive layers M3 is electrically connected between the another one of the two second vias Via2 and another one of the two third vias Via3. The two of the three third conductive layers M3 are extended along a second direction (i.e., a direction X). The first direction is vertical to the second direction. In FIG. 1 and FIG. 3, the three third conductive layers M3 are in a strip-shape and parallel to each other. The two of the three third conductive layers M3 are disposed on two sides of the one of the two third vias Via3 with gaps, respectively, and the aforementioned gaps form the second resistive elements R2. The another one of the two third vias Via3 stacks on another one of the three third conductive layers M3.

The fourth layer L4 includes a fourth conductive layer M4. The fourth conductive layer M4 is electrically connected to the two third vias Via3. In detail, two ends of the fourth conductive layer M4 are connected to the two third vias Via3 of the third layer L3, respectively. The first via Via1, the two second vias Via2 and the two third vias Via3 are made of Cu or other conductive metals.

Figure 4:
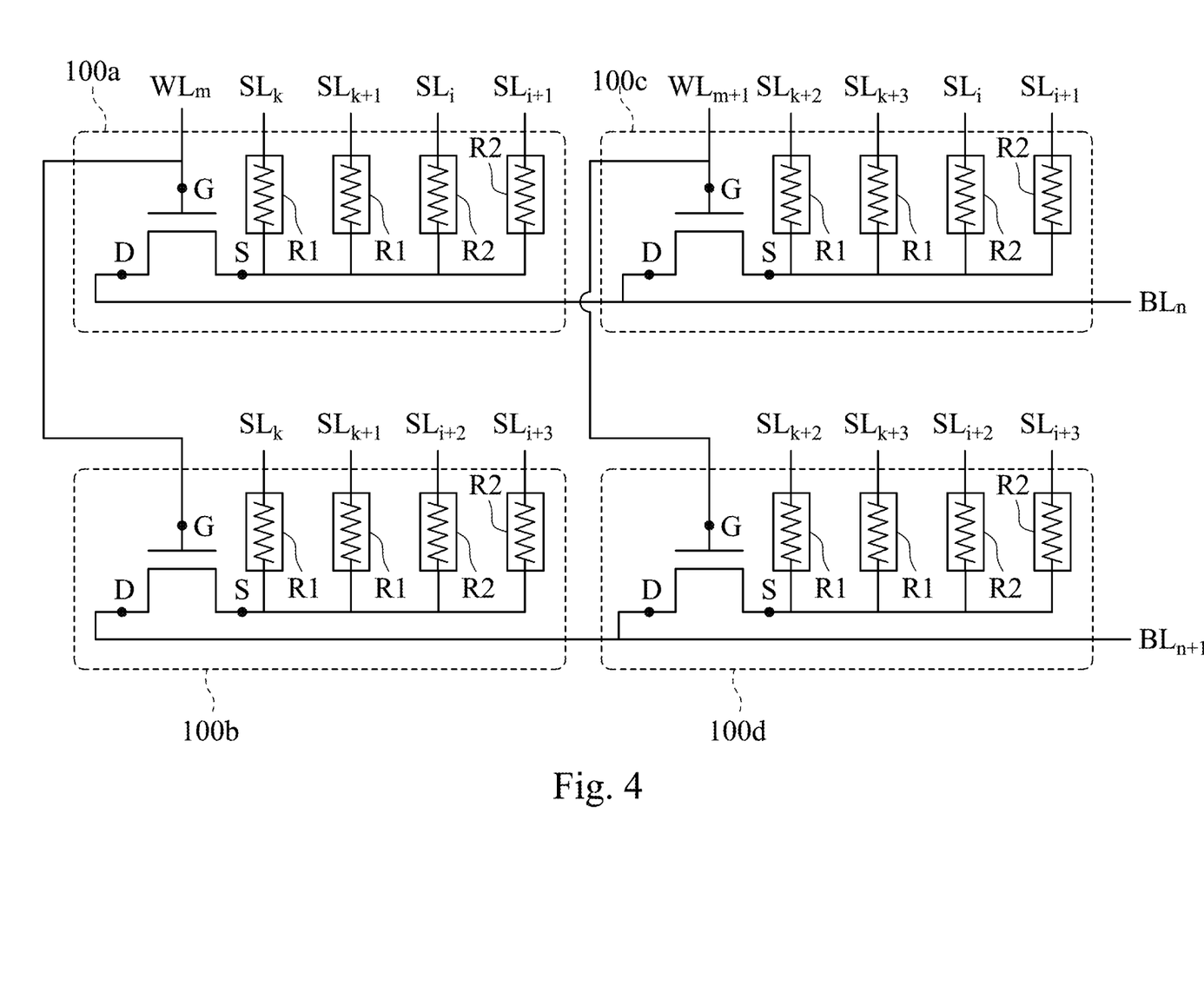
FIG. 4 shows an equivalent circuit diagram of the three-dimensional resistive random access memory structure in FIG. 1.

Please refer to FIG. 2 to FIG. 4. FIG. 4 shows an equivalent circuit diagram of the three-dimensional resistive random access memory structure 100a in FIG. 1. In FIG. 2 and FIG. 4, the source electrode S of the three-dimensional resistive random access memory structure 100a is connected to the third conductive layer M3 via the first conductive layer M1, the first via Via1, the second conductive layer M2 and the second via Via2 on the left side of FIG. 2, and then connected to the second via Via2 and the second conductive layer M2 on the right side of FIG. 2 to form the two first resistive elements R1. In FIG. 3 and FIG. 4, the source electrode S of the three-dimensional resistive random access memory structure 100a is connected to the fourth conductive layer M4 via the first conductive layer M1, the first via Via1, the second conductive layer M2, the second via Via2, the third conductive layer M3 and the third via Via3 on the right side of FIG. 3, and then connected to the third via Via3 and the third conductive layer M3 on the left side of FIG. 3 to form the two second resistive elements R2.

In detail, the memory array with a plurality of resistive elements (i.e., the first resistive elements R1 and the second resistive elements R2) can select to read and write (program) a specific resistive element in the memory array by switching voltages of a plurality of word lines, a plurality of bit lines and a plurality of source lines. The gate electrode G of the base layer Lb of the three-dimensional resistive random access memory structure 100a is electrically connected to the word line $WL_m$. Another one of the two first conductive layers M1, which is electrically connected to the drain electrode D, is electrically connected to the bit line $BL_n$. The two of the three second conductive layers M2, which form the first resistive elements R1 with the second vias Via2, are electrically connected to the source lines $SL_k$, $SL_{k+1}$, respectively. The two of the three third conductive layers M3, which form the second resistive elements R2 with the third vias Via3, are electrically connected to the source lines $SL_i$, $SL_{i+1}$, respectively.

Thus, the three-dimensional resistive random access memory structure 100a of the present disclosure can form the two first resistive elements R1 and the two second resistive elements R2, and increase an amount of the memory elements in a single layer under the limitation of the volume of the integrated circuit to dispose the memory elements in high density.

FIG. 1 shows a three-dimensional schematic view of a memory array which is formed by a plurality of three-dimensional resistive random access memory structures 100a, 100b, 100c and 100d. The structure of each of the three-dimensional resistive random access memory structures 100b, 100c and 100d is the same as the structure of the three-dimensional resistive random access memory structure 100a, and will not be described again. A gate electrode G of the three-dimensional resistive random access memory structure 100b is electrically connected to the gate electrode G of the three-dimensional resistive random access memory structure 100a. Another first conductive layer M1, which is electrically connected to the drain electrode D of the three-dimensional resistive random access memory structure 100b, is electrically connected to the bit line $BL_{n+1}$. The two second conductive layers M2, which form the first resistive elements R1 with the second vias Via2, are electrically connected to the source lines $SL_k$, $SL_{k+1}$, respectively. The two third conductive layers M3, which form the second resistive elements R2 with the third vias Via3, are electrically connected to the source lines $SL_{i+2}$, $SL_{i+3}$, respectively.

A gate electrode G of the three-dimensional resistive random access memory structure 100c is electrically connected to the word line $WL_{m+1}$. Another first conductive layer M1, which is electrically connected to the drain electrode D of the three-dimensional resistive random access memory structure 100c, is electrically connected to the bit line $BL_n$. The two second conductive layers M2, which form the first resistive elements R1 with the second vias Via2, are electrically connected to the source lines $SL_{k+2}$, $SL_{k+3}$, respectively. The two third conductive layers M3, which form the second resistive elements R2 with the third vias Via3, are electrically connected to the source lines $SL_i$, $SL_{i+1}$, respectively.

A gate electrode G of the three-dimensional resistive random access memory structure 100d is electrically connected to the gate electrode G of the three-dimensional resistive random access memory structure 100c. Another first conductive layer M1, which is electrically connected to the drain electrode D, is electrically connected to the bit line $BL_{n+1}$. The two second conductive layers M2, which form the first resistive elements R1 with the second vias Via2, are electrically connected to the source lines $SL_{k+2}$, $SL_{k+3}$, respectively. The two third conductive layers M3, which form the second resistive elements R2 with the third vias Via3, are electrically connected to the source lines $SL_{i+2}$, $SL_{i+3}$, respectively.

In other embodiments of the present disclosure, an amount of the layers of the three-dimensional resistive random access memory structure can be increased along a direction Z according to the requirement of the volume and the size of the memory to form more first resistive elements and more second resistive elements. In detail, another of a second layer and another of a third layer can be additionally arranged between the third layer and the fourth layer in FIG. 1, to form more first resistive elements and more second resistive elements.

Figure 5:
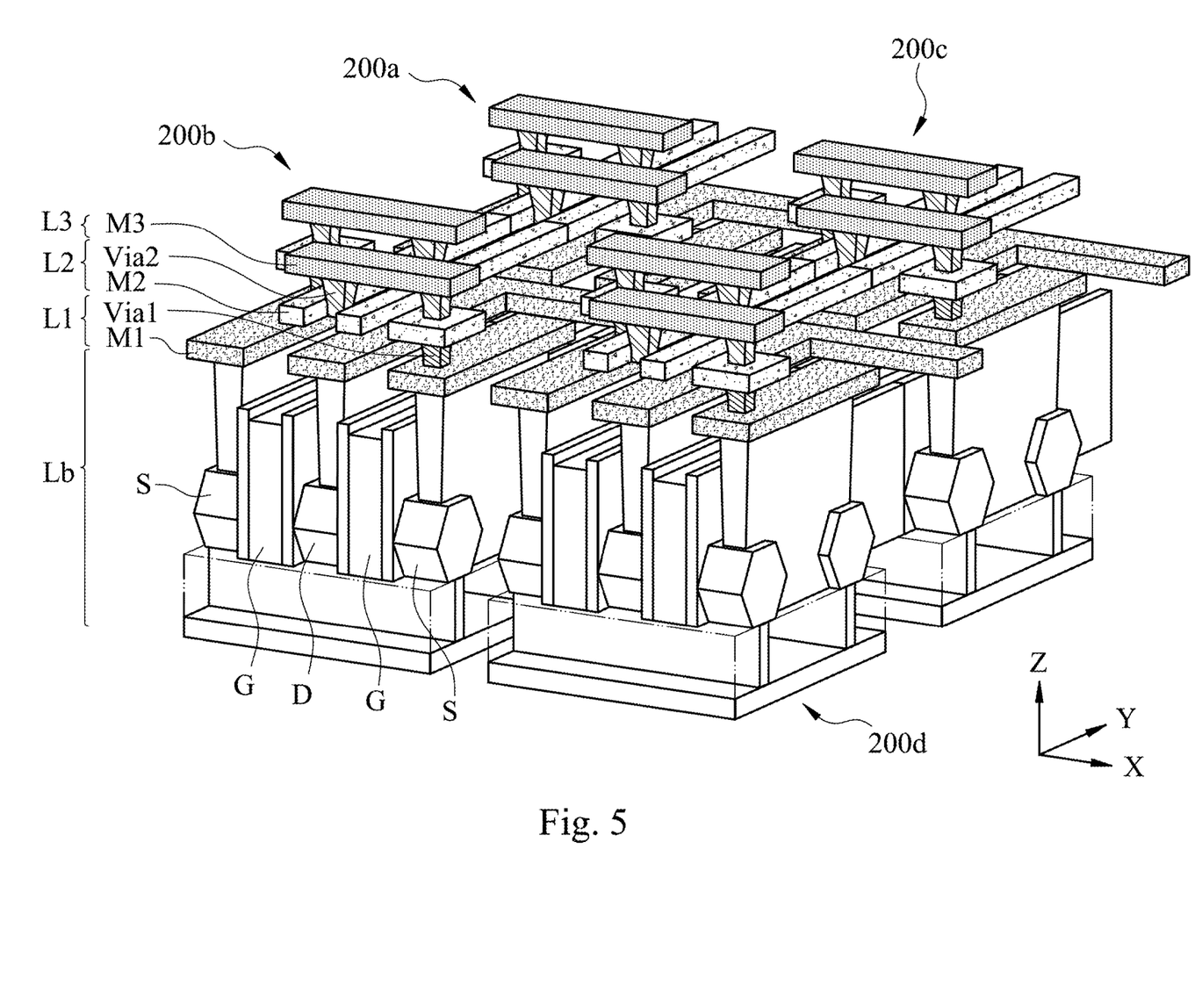
FIG. 5 shows a three-dimensional schematic view of a three-dimensional resistive random access memory structure according to a second embodiment of the present disclosure.

Please refer to FIG. 5. FIG. 5 shows a three-dimensional schematic view of a three-dimensional resistive random access memory structure 200a according to a second embodiment of the present disclosure. FIG. 5 shows four three-dimensional resistive random access memory structures 200a, 200b, 200c and 200d. Each of the four three-dimensional resistive random access memory structures 200a, 200b, 200c and 200d includes a base layer Lb, a first layer L1, a second layer L2 and a third layer L3. The first layer L1 includes at least one first conductive layer M1 and at least one first via Via1. The second layer L2 includes at least one second conductive layer M2 and at least one second via Via2. The third layer L3 includes at least one third conductive layer M3. The base layer Lb is a FinFET, and includes two gate electrodes G, a drain electrode D and two source electrodes S, but the present disclosure is not limited thereto. In detail, the base layer Lb includes two transistor structures, and the two transistor structures share the drain electrode D. One of the two source electrodes S, one of the two gate electrodes G, the drain electrode D, another one of the two gate electrodes G and another one of the two source electrodes S are disposed adjacently in sequence. In the base layer Lb of the three-dimensional resistive random access memory structure 200b in FIG. 5, the source electrode S, the gate electrode G and the drain electrode D from left to right is a set of transistor structure, and the source electrode S, the gate electrode G and the drain electrode D from right to left is another set of transistor structure.

Figure 6:
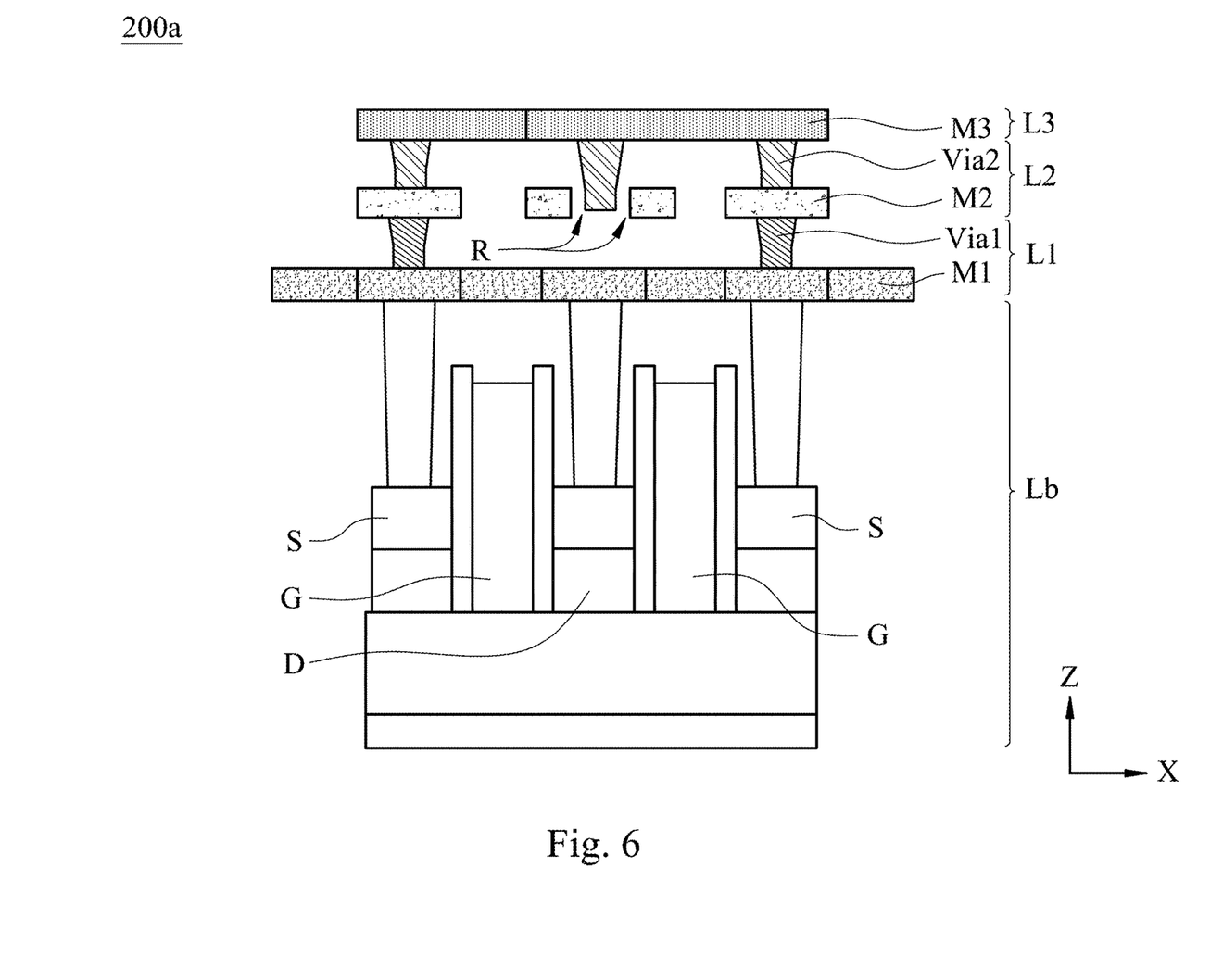
FIG. 6 shows a side view of the three-dimensional resistive random access memory structure in FIG. 5.

Please refer to FIG. 5 and FIG. 6. FIG. 6 shows a side view of the three-dimensional resistive random access memory structure 200a in FIG. 5. The first layer L1 is electrically connected to the base layer Lb, and includes three first conductive layers M1 and two first vias Via1. Two of the three first conductive layers M1 are electrically connected to the two first vias Via1, respectively. In other words, the two of the three first conductive layers M1 are electrically connected to the two source electrode S, respectively, and another one of the three first conductive layers M1 is connected to the drain electrode D.

The second layer L2 includes four second conductive layers M2 and four second vias Via2. Four resistive elements R are formed between two of the four second vias Via2 and two of the four second conductive layers M2. Another two of the four second conductive layers M2 are electrically connected to the two first vias Via1. The another two of the four second conductive layers M2 are electrically connected to another two of the four second vias Via2, respectively. The two of the four second conductive layers M2 are extended along a first direction (i.e., the direction Y). Two disposing positions of two of the four second vias Via2 are corresponding to the drain electrode D. In detail, the two of the four second conductive layers M2 are in a strip-shape, and extended along the first direction. The aforementioned two strip-shape second conductive layers M2 are spaced from each other. The two of the four second vias Via2 are disposed between the two strip-shape second conductive layers M2 along the first direction. Two gaps between one of the two aforementioned second vias Via2 and the two aforementioned strip-shape second conductive layers M2 forms two resistive elements R. Two gaps between another one of the two aforementioned second vias Via2 and the two aforementioned strip-shape second conductive layers M2 form two resistive elements R.

The third layer L3 includes two third conductive layers M3. The two third conductive layers M3 are electrically connected to the four second vias Via2, and extended along a second direction (i.e., the direction X). The first direction is vertical to the second direction. In detail, one of the two third conductive layers M3 (i.e., the third conductive layer M3 on the left side of FIG. 6) is connected to one of the second vias Via2 (i.e., the second via Via2 on the left side of FIG. 6) and one of the second vias Via2, which is corresponding to the drain electrode D. Another one of the two third conductive layers M3 (i.e., the third conductive layer M3 on the right side of FIG. 6) is connected to one of the second vias Via2 (i.e., the second via Via2 on the right side of FIG. 6) and another one of the second vias Via2, which is corresponding to the drain electrode D.

Figure 7:
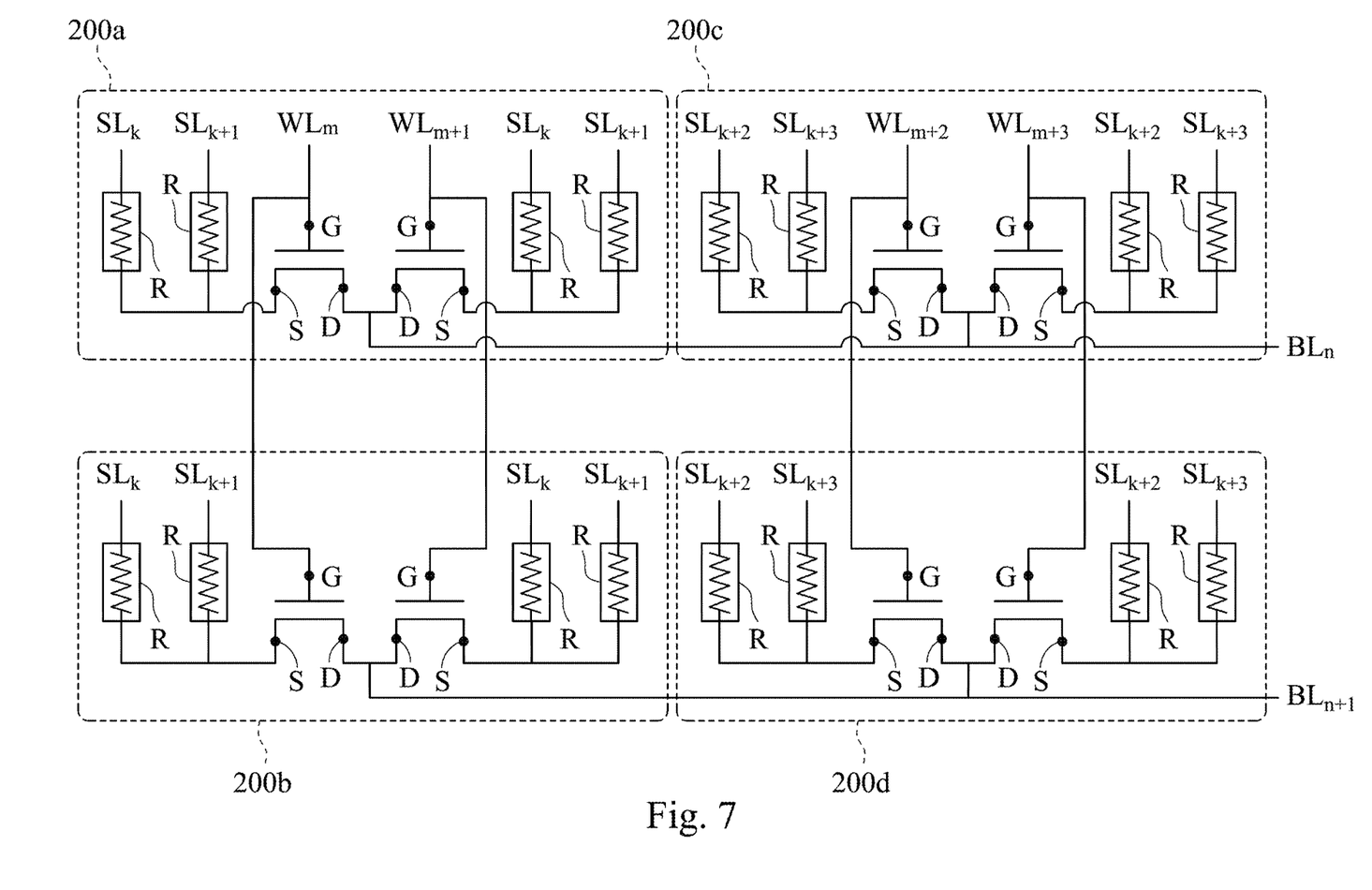
FIG. 7 shows an equivalent circuit diagram of the three-dimensional resistive random access memory structure in FIG. 5.

Please refer to FIG. 5 to FIG. 7. FIG. 7 shows an equivalent circuit diagram of the three-dimensional resistive random access memory structure 200a in FIG. 5. One of the source electrodes S (i.e., the source electrode S on the left side of FIG. 6) of the three-dimensional resistive random access memory structure 200a is connected to the third conductive layer M3 via the first conductive layer M1, the first via Via1, the second conductive layer M2 and the second via Via2 on the left side of FIG. 6, and forms two resistive elements R with two second conductive layers M2 via the second via Via2, which is connected to the third conductive layer M3 (i.e., the third conductive layer M3 on the left side of FIG. 6). Another one of the source electrodes S (i.e., the source electrode S on the right side of FIG. 6) of the three-dimensional resistive random access memory structure 200a is connected to the third conductive layer M3 via the first conductive layer M1, the first via Via1, the second conductive layer M2 and the second via Via2 on the right side of FIG. 6, and forms two resistive elements R with two second conductive layers M2 via the second via Via2, which is connected to the third conductive layer M3 (i.e., the third conductive layer M3 on the right side of FIG. 6).

The two gate electrodes G of the three-dimensional resistive random access memory structure 200a are electrically connected to the word lines $WL_m$, $WL_{m+1}$, respectively. The drain electrode D is electrically connected to the bit line $BL_n$. The two second conductive layers M2, which form the four resistive elements R with the second vias Via2, are electrically connected to the source lines $SL_k$, $SL_{k+1}$.

Thus, the three-dimensional resistive random access memory structure 200a can form the four resistive elements R to increase the density and amount of the memory under the limitation of the area.

FIG. 5 shows a three-dimensional schematic view of a memory array which is formed by a plurality of three-dimensional resistive random access memory structures 200a, 200b, 200c and 200d. The structure of each of the three-dimensional resistive random access memory structures 200b, 200c and 200d is the same as the structure of the three-dimensional resistive random access memory structure 200a, and will not be described again. The two gate electrodes G of the three-dimensional resistive random access memory structure 200b are electrically connected to the word lines $WL_m$, $WL_{m+i}$, respectively. The drain electrode D is electrically connected to the bit line $BL_{n+1}$. The two second conductive layers M2, which form the resistive elements R with the second vias Via2, are electrically connected to the source lines $SL_k$, respectively.

The two gate electrodes G of the three-dimensional resistive random access memory structure 200c are electrically connected to the word lines $WL_{m+2}$, $WL_{m+3}$, respectively. The drain electrode D is electrically connected to the bit line $BL_n$. The two second conductive layers M2, which form the resistive elements R with the second vias Via2, are electrically connected to the source lines $SL_{k+2}$, $SL_{k+3}$, respectively.

The two gate electrodes G of the three-dimensional resistive random access memory structure 200d are electrically connected to the word lines $WL_{m+2}$, $WL_{m+3}$, respectively. The drain electrode D is electrically connected to the bit line $BL_{n+1}$. The two second conductive layers M2, which form the resistive elements R with the second vias Via2, are electrically connected to the source lines $SL_{k+2}$, $SL_{k+3}$, respectively.

In other embodiments of the present disclosure, an amount of the layers of the three-dimensional resistive random access memory structure can be increased along the direction Z according to the requirement of the volume and the size of the memory to form more resistive elements. In detail, the three-dimensional resistive random access memory structure in FIG. 5 can further include a fourth layer, and the third layer can further include two third conductive layers and four third vias. The fourth layer includes two fourth conductive layers. The aforementioned two third conductive layers are extended along the second direction. Two of the four third vias are connected to the two third conductive layers M3 of the three-dimensional resistive random access memory structure 200a in FIG. 5, respectively. The two of the four third vias are also connected to the two fourth conductive layers, respectively. Another two of the four third vias are disposed between the aforementioned two third conductive layers with gaps along the second direction, and form another four resistive elements. Thus, the three-dimensional resistive random access memory structure can superimpose more conductive layers and vias according to an arranging rule (i.e., the arranging directions of the two adjacent conductive layers are vertical to each other) as required to form more resistive elements.

According to the aforementioned embodiments and examples, the advantages of the present disclosure are described as follows.

1. The three-dimensional resistive random access memory structure of the present disclosure can arrange to form two first resistive elements and two second resistive elements, increase an amount of the memory elements in a single layer under the limitation of the volume of the integrated circuit to dispose the memory elements in high density.

2. The three-dimensional resistive random access memory structure can form four resistive elements to increase the density and amount of the memory under the limitation of the area.

3. The three-dimensional resistive random access memory structure can superimpose more conductive layers and vias according to an arranging rule (i.e., the arranging directions of the two adjacent conductive layers are vertical to each other) as required to form more resistive elements.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A three-dimensional resistive random access memory structure, comprising:
a base layer;
a first layer comprising two first conductive layers and a first via, wherein one of the two first conductive layers is electrically connected between the base layer and the first via;
a second layer comprising three second conductive layers and two second vias, wherein two first resistive elements are formed between one of the two second vias and two of the three second conductive layers, another one of the three second conductive layers is electrically connected between the first via and another one of the two second vias, and the two of the three second conductive layers are extended along a first direction;
a third layer comprising three third conductive layers and two third vias, wherein two second resistive elements are formed between one of the two third vias and two of the three third conductive layers, another one of the three third conductive layers is electrically connected between the another one of the two second vias and another one of the two third vias, and the two of the three third conductive layers are extended along a second direction; and a fourth layer comprising a fourth conductive layer, wherein the fourth conductive layer is electrically connected to the two third vias;

wherein the first direction is vertical to the second direction.

2. The three-dimensional resistive random access memory structure of claim 1, wherein the base layer comprises a gate electrode, the gate electrode is electrically connected to a word line, another one of the two first conductive layers is electrically connected to a bit line, and each of the two of the three second conductive layers and the two of the three third conductive layers are electrically connected to a source line.

3. The three-dimensional resistive random access memory structure of claim 1, wherein the base layer, the first layer, the second layer, the third layer and the fourth layer are stacked in sequence.

4. The three-dimensional resistive random access memory structure of claim 1, wherein the base layer is a Fin Field-Effect Transistor (FinFET).

5. The three-dimensional resistive random access memory structure of claim 1, wherein the first via, the two second vias and the two third vias are made of metal.

6. A three-dimensional resistive random access memory structure, comprising:
  a base layer;
  a first layer electrically connected to the base layer, and comprising three first conductive layers and two first vias, wherein two of the three first conductive layers are electrically connected to the two first vias, respectively;
  a second layer comprising four second conductive layers and four second vias, wherein four resistive elements are formed between two of the four second vias and two of the four second conductive layers, another two of the four second conductive layers are electrically connected to the two first vias, the another two of the four second conductive layers are electrically connected to another two of the four second vias, respectively, and the two of the four second conductive layers are extended along a first direction; and
  a third layer comprising two third conductive layers, wherein the two third conductive layers are electrically connected to the four second vias, and the two third conductive layers are extended along a second direction;

wherein the first direction is vertical to the second direction.

7. The three-dimensional resistive random access memory structure of claim 6, wherein the base layer comprising:
  two gate electrodes;
  two source electrodes electrically connected to the two of the three first conductive layers, respectively; and
  a drain electrode electrically connected to another one of the three first conductive layers;
  wherein one of the two source electrodes, one of the two gate electrodes, the drain electrode, another one of the two gate electrodes and another one of the two source electrodes are disposed adjacently in sequence.

8. The three-dimensional resistive random access memory structure of claim 7, wherein each of the two gate electrodes is electrically connected to a word line, the another one of the three first conductive layers is electrically connected to a bit line, and each of the two of the four second conductive layers and the two third conductive layers is electrically connected to a source line.

9. The three-dimensional resistive random access memory structure of claim 6, wherein the base layer is a Fin Field-Effect Transistor (FinFET).

10. The three-dimensional resistive random access memory structure of claim 7, wherein two disposing positions of the two of the four second vias are corresponding to the drain electrode.

* * * * *